(12) United States Patent
Li

(10) Patent No.: US 9,793,411 B2
(45) Date of Patent: Oct. 17, 2017

(54) MANUFACTURING METHOD AND STRUCTURE OF OXIDE SEMICONDUCTOR TFT SUBSTRATE

(71) Applicant: Shenzhen China Star Optoelectronics Technology Co., Ltd., Shenzhen, Guangdong (CN)

(72) Inventor: Wenhui Li, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/426,989

(22) PCT Filed: Sep. 19, 2014

(86) PCT No.: PCT/CN2014/086884
§ 371 (c)(1),
(2) Date: Mar. 9, 2015

(87) PCT Pub. No.: WO2016/033838
PCT Pub. Date: Mar. 10, 2016

(65) Prior Publication Data
US 2016/0247926 A1 Aug. 25, 2016

(30) Foreign Application Priority Data
Sep. 2, 2014 (CN) .......................... 2014 1 0444172

(51) Int. Cl.
*H01L 29/786* (2006.01)
*H01L 29/66* (2006.01)
(52) U.S. Cl.
CPC .... *H01L 29/7869* (2013.01); *H01L 29/66969* (2013.01); *H01L 29/786* (2013.01)

(58) Field of Classification Search
CPC . H01L 27/124; H01L 27/1225; H01L 29/786; H01L 29/78603; H01L 29/7869; H01L 29/78696
See application file for complete search history.

(56) References Cited

U.S. PATENT DOCUMENTS 6,833,882 B2 * 12/2004 Lee .................. G02F 1/136259
349/139
8,304,778 B2 * 11/2012 Wu .................... H01L 29/41733
257/57

(Continued)

FOREIGN PATENT DOCUMENTS

CN            103094354 A     5/2013
WO     WO2011027649 A1     3/2011

*Primary Examiner* — Marcos D Pizzaro
*Assistant Examiner* — Shannon Yi
(74) *Attorney, Agent, or Firm* — Andrew C. Cheng

(57) ABSTRACT

The present invention provides a manufacturing method and a structure of an oxide semiconductor TFT substrate, in which an oxide conductor layer is used to define a channel and a source terminal of an oxide semiconductor TFT substrate. Since the oxide conductor layer is relatively thin and compared to the known techniques, the width of the channel can be made smaller and the width of the channel can be controlled precisely, the difficult of the manufacturing process of the oxide semiconductor TFT substrate can be reduced and the performance of the oxide semiconductor TFT substrate can be enhanced and the yield rate of manufacture can be increased. In a structure of an oxide semiconductor TFT substrate manufactured with the present invention, since the oxide conductor layer and the oxide semiconductor layer are similar in structural composition, excellent ohmic contact can be formed; the oxide semiconductor layer has better capability of inclining upward and the oxide conductor does not cause metal ion contamination in (Continued)

the oxide semiconductor layer; and the oxide conductor is transparent so as to help increase aperture ratio.

10 Claims, 4 Drawing Sheets

(56) References Cited

U.S. PATENT DOCUMENTS

| | | | |
|---|---|---|---|
| 8,486,284 B2* | 7/2013 | Yang | G06F 3/041 178/18.01 |
| 2015/0241744 A1* | 8/2015 | Nakata | H01L 27/0296 349/42 |
| 2016/0293613 A1* | 10/2016 | Katoh | H01L 27/1225 |

* cited by examiner

MANUFACTURING METHOD AND STRUCTURE OF OXIDE SEMICONDUCTOR TFT SUBSTRATE

BACKGROUND OF THE INVENTION

1. Field of the Invention

The present invention relates to the field of display technology, and in particular to a manufacturing method of an oxide semiconductor thin-film transistor (TFT) substrate and a structure thereof.

2. The Related Arts

Flat panel display devices have a variety of advantages, such as thin device body, low power consumption, and being free of radiation, and are thus of wide applications. The flat panel display devices that are currently available generally comprise liquid crystal displays (LCDs) and organic light emitting displays (OLEDs).

A comparison between the OLED display technology that is based on organic light emitting diodes and the mature LCD reveals that the OLED is a self-luminous display device having advantages of being self-luminous, high contrast, wide view angle (reaching 170°), fast response, high luminous efficiency, low operation voltage (3-10V), and being ultra-thin (thickness being less than 2 mm) and possessing excellent color display quality, a widened viewing range, and enhanced design flexibility.

Thin-film transistors (TFTs) are a vital constituent component of the flat panel display device and can be formed on a glass substrate or a plastic substrate to serve as a switching device and a driving device in for example LCDs, OLEDs, and electrophoretic displays (EPDs).

Oxide semiconductor TFT technology is one of the hottest contemporary techniques. The oxide semiconductors have a relatively high electron mobility (the electron mobility of the oxide semiconductors being greater than 10 cm$^2$/Vs, while the mobility of a-Si is only 0.5-0.8 cm$^2$/Vs) and, compared to low-temperature poly-silicon (LTPS), the oxide semiconductor has a simple manufacturing process and has relatively high compatibility with a-Si manufacturing processes, making it possible to be applied to LCDs (Liquid Crystal Displays), organic light emitting displays (OLEDs), and flexible displays and also applicable to displays of both large and small sizes and having a prosperous future of development and applications so as to be the hot topic of contemporary researches of the industry.

However, the applications and developments of the oxide semiconductor still face a lot of challenges.

FIG. 1 shows a conventional BCE (Back Channel Etching) TFT, which has a simple structure and less steps of manufacture and is the one that has the highest yield rate and is the most mature in the manufactures of a-Si TFT. Thus, developing BCE oxide semiconductor TFT that has excellent performance is also a hot issue of contemporary researches. A conventional BCE oxide semiconductor TFT comprises a substrate 100, a gate terminal 200, a gate insulation layer 300, and an oxide semiconductor layer 600 located on the gate insulation layer 300. After the formation of the oxide semiconductor layer 600, metal source/drain electrodes 400 are formed. The metal electrodes uses a wet etching process in which a strong acid and the mixture (HNO$_3$/H$_3$PO$_4$/CH$_3$COOH) thereof is used, which may cause damage to the oxide semiconductor in the back channel, making the manufacture more difficult. The source/drain electrodes 400 are generally of a great thickness and it is hard to control line widths in patternization operations. It is easy to cause deviation of the channel width.

FIG. 2 shows a conventional ESL (Etch Stop Layer) TFT, which comprises a substrate 100, a gate terminal 200, a gate insulation layer 300, IGZO (Indium Gallium Zinc Oxide) formed on the gate insulation layer 300, and metal source/drain electrodes 400. The channel of IGZO 600 comprises thereon a protection layer 700 to protect the IGZO 600 from being damaged. However, an additional process of forming the ESL 700 is needed and the width of the channel is increased, making the size of the TFT expanded and the available design space reduced.

FIG. 3 shows a conventional reversed coplanar TFT, which comprises a substrate 100, a gate terminal 200, a gate insulation layer 300, source/drain electrodes 400 that are formed earlier, and IGZO 600 that is formed later. Due to the thickness of the source/drain electrodes 400, it is easy for the IGZO 600 to become poor on the side slopes of the channel, making the performance affected. Further, metal ions of source/drain electrodes 400 may easily diffuse from the cutting site thereof into the IGZO 600 so as to contaminate the IGZO 600. The source/drain electrodes 400 are generally of a great thickness and it is hard to control line widths in patternization operations. It is easy to cause deviation of the channel width.

SUMMARY OF THE INVENTION

An object of the present invention is to provide a manufacturing method of an oxide semiconductor TFT substrate, which reduces the difficulty of the conventional manufacturing process of oxide semiconductor TFT substrates, improves the performance of the substrate, increases the yield rate of manufacture, and uses an oxide conductor to define a channel of the oxide semiconductor TFT substrate and forming a source terminal so as to allow a channel width to be made smaller thereby reducing the size of the TFT and making channel width more accurate.

Another object of the present invention is to provide a structure of an oxide semiconductor TFT substrate, which uses an oxide conductor to define a channel of the TFT substrate and forms a source terminal, wherein the oxide conductor is similar to the oxide semiconductor in structural composition so that an excellent ohmic contact can be formed; the oxide conductor has better capability of inclining upward and the oxide conductor does not cause metal ion contamination in the oxide semiconductor layer; and the oxide conductor is transparent so as to help increase aperture ratio.

To achieve the above objects, the present invention provides a manufacturing method of an oxide semiconductor thin-film transistor (TFT) substrate, which comprises the following steps:

Step 1: providing a substrate and depositing and patternizing a first metal layer on the substrate to form a gate terminal;

Step 2: depositing a gate insulation layer on the gate terminal and the substrate; and Step 3: forming a drain terminal, a source terminal, and an oxide semiconductor layer on the gate insulation layer.

An operation of Step 3 comprises:

Step 31: depositing and patternizing a second metal layer on the gate insulation layer to form a drain terminal;

Step 32: depositing and patternizing an oxide conductor layer on the drain terminal and the gate insulation layer to form a channel and a source terminal, wherein the drain terminal is lap-jointed to the oxide conductor layer; and Step 33: depositing and patternizing an oxide semiconductor layer on the drain terminal and the source terminal to form an oxide semiconductor layer.

An operation of Step 3 comprises:

Step 311: depositing and patternizing an oxide conductor layer on the gate insulation layer to form a channel and a source terminal;

Step 312: depositing and patternizing a second metal layer on the oxide conductor layer and the gate insulation layer to form a drain terminal, wherein the drain terminal is lap-joined to the oxide conductor layer; and Step 313: depositing and patternizing an oxide semiconductor layer on the drain terminal and the source terminal to form an oxide semiconductor layer.

The patternizing operation is achieved with yellow light and etching processes.

The substrate is a glass substrate and the oxide semiconductor layer is indium gallium zinc oxide (IGZO).

The oxide conductor layer is indium tin oxide (ITO) or indium zinc oxide (IZO) and the oxide conductor layer has a thickness less than a thickness of the drain terminal.

The source terminal also functions as a pixel electrode.

The present invention also provides a structure of an oxide semiconductor thin-film transistor (TFT) substrate, which comprises: a substrate, a gate terminal formed on the substrate, a gate insulation layer formed on the substrate and the gate terminal, a drain terminal and a source terminal formed on the gate insulation layer, a channel formed between the drain terminal and the source terminal, and an oxide semiconductor layer formed on the drain terminal and the source terminal.

The channel and the source terminal are formed by being defined by an oxide conductor layer.

The oxide conductor layer is indium tin oxide (ITO) or indium zinc oxide (IZO); the oxide conductor layer has a thickness less than a thickness of the drain terminal; the oxide semiconductor layer is indium gallium zinc oxide (IGZO); and the source terminal also functions as a pixel electrode.

The efficacy of the present invention is that the present invention provides a manufacturing method and a structure of an oxide semiconductor TFT substrate, in which an oxide conductor layer is used to define a channel and a source terminal of an oxide semiconductor TFT substrate. Since the oxide conductor layer is relatively thin and compared to the known techniques, the width of the channel can be made smaller and the width of the channel can be controlled precisely, the difficult of the manufacturing process of the oxide semiconductor TFT substrate can be reduced and the performance of the oxide semiconductor TFT substrate can be enhanced and the yield rate of manufacture can be increased. In a structure of an oxide semiconductor TFT substrate manufactured with the present invention, since the oxide conductor layer and the oxide semiconductor layer are similar in structural composition, excellent ohmic contact can be formed; the oxide semiconductor layer has better capability of inclining upward and the oxide conductor does not cause metal ion contamination in the oxide semiconductor layer; and the oxide conductor is transparent so as to help increase aperture ratio.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
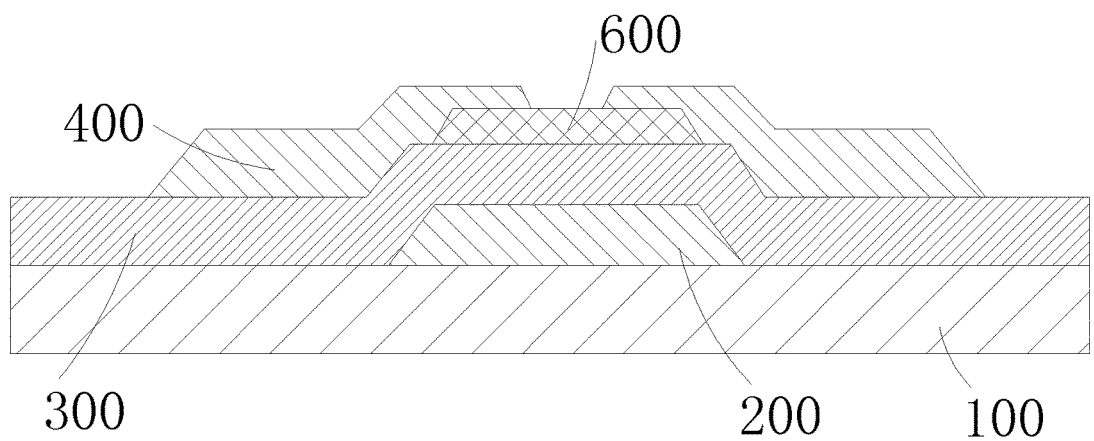
FIG. 1 is a cross-sectional view showing a structure of a conventional oxide semiconductor thin-film transistor (TFT) substrate.
Figure 2:
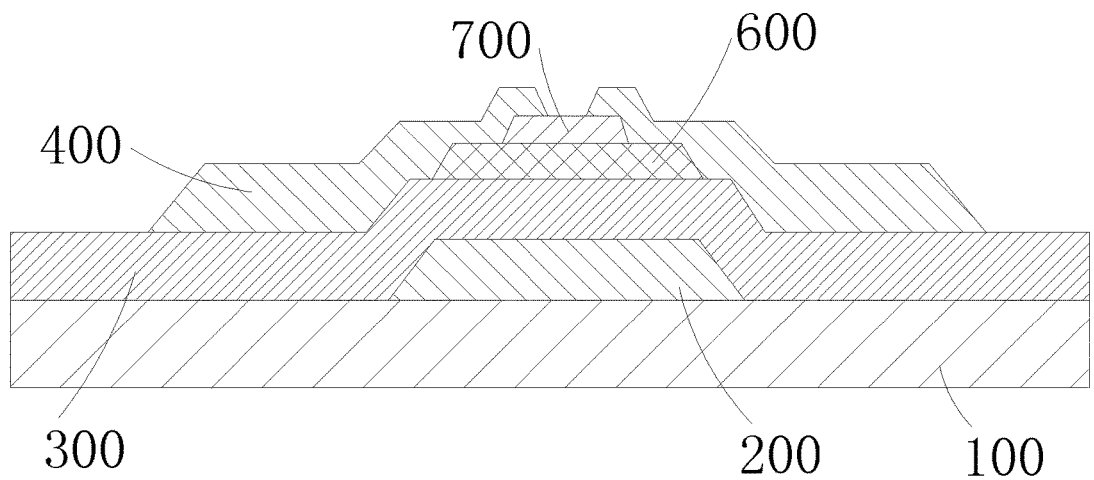
FIG. 2 is a cross-sectional view showing a structure of another conventional oxide semiconductor TFT substrate.
Figure 3:
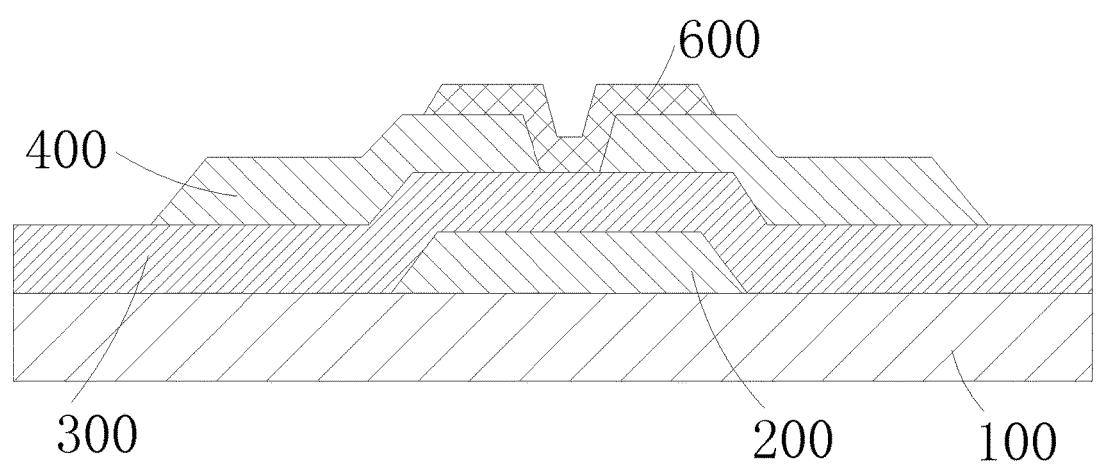
FIG. 3 is a cross-sectional view showing a structure of a further conventional oxide semiconductor TFT substrate.
Figure 4:
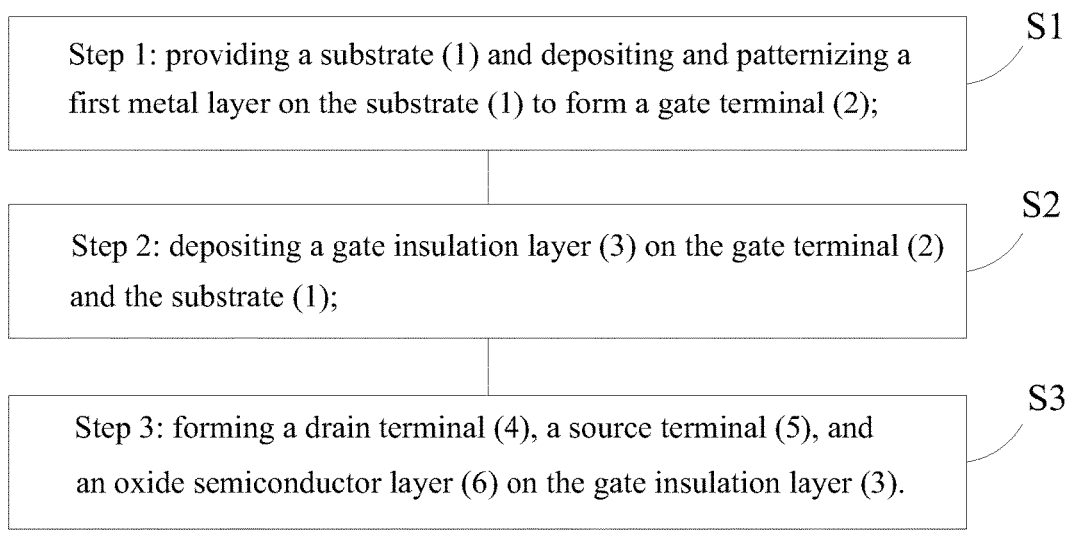
FIG. 4 is a flow chart illustrating a manufacturing method of an oxide semiconductor TFT substrate according to the present invention.
Figure 5:
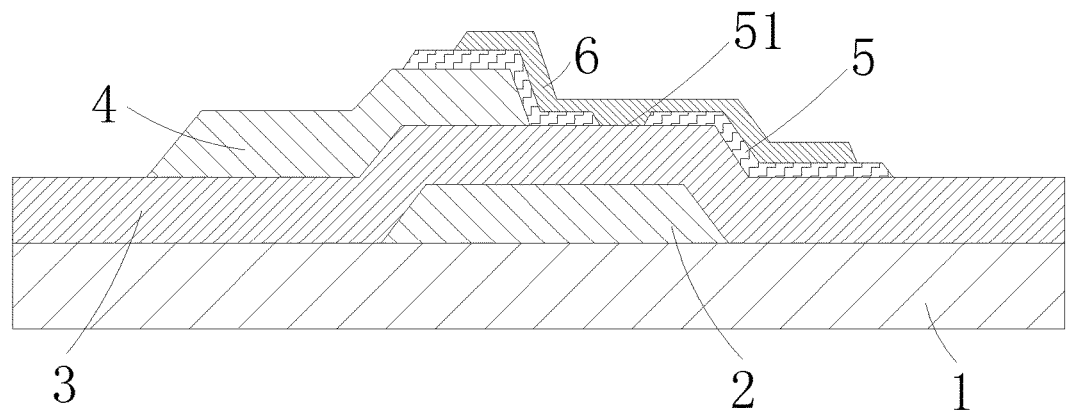
FIG. 5 is a cross-sectional view showing a structure of an oxide semiconductor TFT substrate according to a first embodiment of the present invention.

Referring collectively to FIGS. 4 and 5, a manufacturing method of an oxide semiconductor TFT substrate according to a first embodiment of the present invention comprises the following steps:

Step 1 (S1): providing a substrate 1 and depositing and patternizing a first metal layer on the substrate 1 to form a gate terminal 2.

Preferably, the substrate 1 is a glass substrate.

Step 2 (S2): depositing a gate insulation layer 3 on the gate terminal 2 and the substrate 1.

The gate insulation layer 3 completely covers the gate terminal 2 and the substrate 1.

Step 3 (S3): depositing and patternizing a second metal layer on the gate insulation layer 3 to form a drain terminal 4.

Step 4: depositing and patternizing an oxide conductor layer on the drain terminal 4 and the gate insulation layer 3 to form a channel 51 and a source terminal 5.

The drain terminal 4 is lap-jointed to the oxide conductor layer.

The oxide conductor layer has a thickness less than a thickness of the drain terminal 4. The oxide conductor layer is ITO (Indium Tin Oxide) or IZO (Indium Zinc Oxide). Preferably, the oxide conductor layer is ITO. The source terminal 5 also functions as a pixel electrode.

Step 5: depositing and patternizing an oxide semiconductor layer on the drain terminal 4 and the source terminal 5 to form an oxide semiconductor layer 6.

Preferably, the oxide semiconductor layer 6 is IGZO (Indium Gallium Zinc Oxide).

The patternizing operation is achieved with yellow light and etching processes.

As shown in FIG. 5, based on the manufacturing method of the first embodiment described above, the present invention also provides a structure of an oxide semiconductor TFT substrate, which comprises: a substrate 1, a gate terminal 2 formed on the substrate 1, a gate insulation layer 3 formed on the substrate 1 and the gate terminal 2, a drain terminal 4 and a source terminal 5 formed on the gate insulation layer 3, a channel 51 formed between the drain terminal 4 and the source terminal 5, and an oxide semiconductor layer 6 formed on the drain terminal 4 and the source terminal 5. The oxide semiconductor layer 6 fills up the channel 51.

The channel 51 and the source terminal 4 are formed by being defined by the oxide conductor layer.

The oxide conductor layer has a thickness less than a thickness of the drain terminal 4. The oxide conductor layer is ITO or IZO. Preferably, the oxide conductor layer is ITO. The oxide semiconductor layer 6 is IGZO. The source terminal 5 also functions as a pixel electrode.

Figure 6:
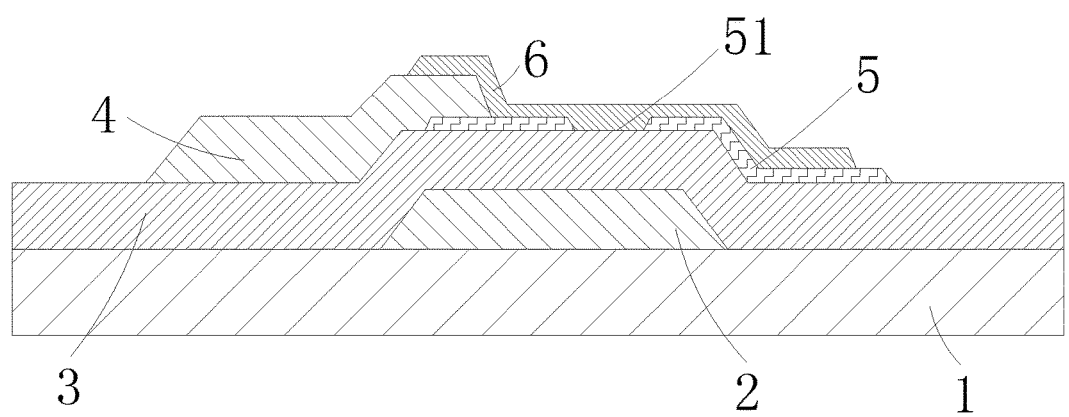
FIG. 6 is a cross-sectional view showing a structure of an oxide semiconductor TFT substrate according to a second embodiment of the present invention.

Referring collectively to FIGS. 4 and 6, a manufacturing method of an oxide semiconductor TFT substrate according to a second embodiment of the present invention comprises the following steps:

Step 1 (S1): providing a substrate 1 and depositing and patternizing a first metal layer on the substrate 1 to form a gate terminal 2.

Preferably, the substrate 1 is a glass substrate.

Step 2 (S2): depositing a gate insulation layer 3 on the gate terminal 2 and the substrate 1.

Step 3 (S3): depositing and patternizing an oxide conductor layer on the gate insulation layer 3 to form a source terminal 5 and a channel 51.

The oxide conductor layer is ITO or IZO. Preferably, the oxide conductor layer is ITO. The source terminal 5 also functions as a pixel electrode.

Step 4: depositing and patternizing a second metal layer on the oxide conductor layer and the gate insulation layer 3 to form a drain terminal 4.

The drain terminal 4 is lap-jointed to the oxide conductor layer.

The oxide conductor layer has a thickness less than a thickness of the drain terminal 4.

Step 5: depositing and patternizing an oxide semiconductor layer on the drain terminal 4 and the source terminal 5 to form an oxide semiconductor layer 6.

Preferably, the oxide semiconductor layer 6 is IGZO.

The patternizing operation is achieved with yellow light and etching processes.

As shown in FIG. 6, based on the manufacturing method of the second embodiment described above, the present invention also provides a structure of an oxide semiconductor TFT substrate, which comprises: a substrate 1, a gate terminal 2 formed on the substrate 1, a gate insulation layer 3 formed on the substrate 1 and the gate terminal 2, a drain terminal 4 and a source terminal 5 formed on the gate insulation layer 3, a channel 51 formed between the drain terminal 4 and the source terminal 5, and an oxide semiconductor layer 6 formed on the drain terminal 4 and the source terminal 5. The oxide semiconductor layer 6 fills up the channel 51.

The channel 51 and the source terminal 4 are formed by being defined by the oxide conductor layer.

The oxide conductor layer has a thickness less than a thickness of the drain terminal 4. The oxide conductor layer is ITO or IZO. Preferably, the oxide conductor layer is ITO. The oxide semiconductor layer 6 is IGZO. The source terminal 5 also functions as a pixel electrode.

It is noted here that the oxide semiconductor layer used in the manufacturing method of an oxide semiconductor TFT substrate according to the present invention can be replaced with other semiconductors, such as a-Si (Amorphous Silicon), poly-silicon semiconductor, and organic semiconductors. Further, the structure of the oxide semiconductor TFT substrate according to the present invention is applicable to LCDs, OLEDs, and EPDs and is also applicable to the field of active display devices, such as non-flexible or flexible display devices. Further, display devices of large, medium, and small sizes can all use the structure of the oxide semiconductor TFT substrate according to the present invention.

In summary, the present invention provides a manufacturing method and a structure of an oxide semiconductor TFT substrate, in which an oxide conductor layer is used to define a channel and a source terminal of an oxide semiconductor TFT substrate. Since the oxide conductor layer is relatively thin and compared to the known techniques, the width of the channel can be made smaller and the width of the channel can be controlled precisely, the difficult of the manufacturing process of the oxide semiconductor TFT substrate can be reduced and the performance of the oxide semiconductor TFT substrate can be enhanced and the yield rate of manufacture can be increased. In a structure of an oxide semiconductor TFT substrate manufactured with the present invention, since the oxide conductor layer and the oxide semiconductor layer are similar in structural composition, excellent ohmic contact can be formed; the oxide semiconductor layer has better capability of inclining upward and the oxide conductor does not cause metal ion contamination in the oxide semiconductor layer; and the oxide conductor is transparent so as to help increase aperture ratio.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A manufacturing method of an oxide semiconductor thin-film transistor (TFT) substrate, comprising the following steps:

Step 1: providing a substrate and depositing and patternizing a first metal layer on the substrate to form a gate terminal;

Step 2: depositing a gate insulation layer on the gate terminal and the substrate; and Step 3: forming a drain terminal, a source terminal, and an oxide semiconductor layer on the gate insulation layer and in contact engagement with the drain terminal and the source terminal, wherein the drain terminal is made of a metal and the source terminal is made of an oxide conductor, the metal of the drain terminal and the oxide conductor of the source terminal being both in direct contact with the gate insulation layer, and the oxide semiconductor layer is located above the drain terminal and the source terminal such that the drain terminal, the source terminal, and the gate terminal are all located on the same side of the oxide semiconductor layer.

2. The manufacturing method of an oxide semiconductor TFT substrate as claimed in claim 1, wherein an operation of Step 3 comprises:

Step 31: depositing and patternizing a second metal layer on the gate insulation layer to form a drain terminal;

Step 32: depositing and patternizing an oxide conductor layer on the drain terminal and the gate insulation layer to form a channel and a source terminal, wherein the drain terminal is partly lapping under and jointed to a first portion of the oxide conductor layer; the source terminal comprises a second portion of the oxide conductor layer; and the channel is formed of a void space formed in the oxide conductor layer and located between the first and second portions of the oxide conductor layer and is thus between the source terminal and the drain terminal; and Step 33: depositing and patternizing an oxide semiconductor layer on the drain terminal and the source terminal to form an oxide semiconductor layer that fills up the void space of the oxide conductor layer.

3. The manufacturing method of an oxide semiconductor TFT substrate as claimed in claim 1, wherein an operation of Step 3 comprises:

Step 311: depositing and patternizing an oxide conductor layer on the gate insulation layer to form a channel and a source terminal, wherein the channel is formed of a void space formed in the oxide conductor layer and is located between a first portion and a second portion of the oxide conductor layer, and the source terminal comprises the second portion of the oxide conductor layer;

Step 312: depositing and patternizing a second metal layer on the oxide conductor layer and the gate insulation layer to form a drain terminal, wherein the drain terminal has a portion lapping over and jointed to the first portion of the oxide conductor layer, a remaining portion of the drain terminal being directly formed on the gate insulation layer, and the channel is located between the drain terminal and the source terminal; and Step 313: depositing and patternizing an oxide semiconductor layer on the drain terminal and the source terminal to form an oxide semiconductor layer that fills up the void space of the oxide conductor layer.

4. The manufacturing method of an oxide semiconductor TFT substrate as claimed in claim 1, wherein the patternizing operation is achieved with yellow light and etching processes.

5. The manufacturing method of an oxide semiconductor TFT substrate as claimed in claim 1, wherein the substrate is a glass substrate and the oxide semiconductor layer is indium gallium zinc oxide (IGZO).

6. The manufacturing method of an oxide semiconductor TFT substrate as claimed in claim 1, wherein the source terminal also functions as a pixel electrode.

7. The manufacturing method of an oxide semiconductor TFT substrate as claimed in claim 2, wherein the oxide conductor layer is indium tin oxide (ITO) or indium zinc oxide (IZO) and the oxide conductor layer has a thickness less than a thickness of the drain terminal.

8. A structure of an oxide semiconductor thin-film transistor (TFT) substrate, comprising: a substrate, a gate terminal formed on the substrate, a gate insulation layer formed on the substrate and the gate terminal, a drain terminal and a source terminal formed on the gate insulation layer, a channel formed between the drain terminal and the source terminal, and an oxide semiconductor layer formed on and in contact engagement with the drain terminal and the source terminal, wherein the channel and the source terminal are formed of an oxide conductor layer that comprises a first portion lapping and in contact engagement with the drain terminal and a second portion forming the source terminal, a void space being formed in the oxide conductor layer and located between the first and second portions to define the channel, the oxide semiconductor layer being arranged to fill up the void space of the oxide conductor layer; and wherein the drain terminal is made of a metal, the metal of the drain terminal and the oxide conductor of the source terminal being both in direct contact with the gate insulation layer, and the oxide semiconductor layer is located above the drain terminal and the source terminal such that the drain terminal, the source terminal, and the gate terminal are all located on the same side of the oxide semiconductor layer.

9. The structure of the oxide semiconductor TFT substrate as claimed in claim 8, wherein the oxide conductor layer is indium tin oxide (ITO) or indium zinc oxide (IZO); the oxide conductor layer has a thickness less than a thickness of the drain terminal; the oxide semiconductor layer is indium gallium zinc oxide (IGZO); and the source terminal also functions as a pixel electrode.

10. A structure of an oxide semiconductor thin-film transistor (TFT) substrate, comprising: a substrate, a gate terminal formed on the substrate, a gate insulation layer formed on the substrate and the gate terminal, a drain terminal and a source terminal formed on the gate insulation layer, a channel formed between the drain terminal and the source terminal, and an oxide semiconductor layer formed on and in contact engagement with the drain terminal and the source terminal;

wherein the channel and the source terminal are formed of an oxide conductor layer that comprises a first portion lapping and in contact engagement with the drain terminal and a second portion forming the source terminal, a void space being formed in the oxide conductor layer and located between the first and second portions to define the channel, the oxide semiconductor layer being arranged to fill up the void space of the oxide conductor layer; and wherein the drain terminal is made of a metal, the metal of the drain terminal and the oxide conductor of the source terminal being both in direct contact with the gate insulation layer, and the oxide semiconductor layer is located above the drain terminal and the source terminal such that the drain terminal, the source terminal, and the gate terminal are all located on the same side of the oxide semiconductor layer; and wherein the oxide conductor layer is indium tin oxide (ITO) or indium zinc oxide (IZO); the oxide conductor layer has a thickness less than a thickness of the drain terminal; the oxide semiconductor layer is indium gallium zinc oxide (IGZO); and the source terminal also functions as a pixel electrode.

* * * * *